(12) United States Patent
Sett et al.

(10) Patent No.: US 10,402,517 B2
(45) Date of Patent: Sep. 3, 2019

(54) MUSCULO-SKELETAL MODELING USING FINITE ELEMENT ANALYSIS, PROCESS INTEGRATION, AND DESIGN OPTIMIZATION

(71) Applicant: Dassault Systémes Simulia Corp., Providence, RI (US)

(72) Inventors: Subham Sett, Providence, RI (US); Victor George Oancea, Providence, RI (US); Juan Antonio Hurtado, Providence, RI (US); Manoj Kumar Mohanram Chinnakonda, Providence, RI (US); Prabhav Saraswat, Providence, RI (US); Jiang Yao, Providence, RI (US)

(73) Assignee: DASSAULT SYSTÉMES SIMULIA CORP., Johnston, RI (US)

( * ) Notice: Subject to any disclaimer, the term of this patent is extended or adjusted under 35 U.S.C. 154(b) by 771 days.

(21) Appl. No.: 13/927,898

(22) Filed: Jun. 26, 2013

(65) Prior Publication Data
US 2015/0006120 A1 Jan. 1, 2015

(51) Int. Cl.
G06F 17/50 (2006.01)
G09B 23/32 (2006.01)

(52) U.S. Cl.
CPC ........ *G06F 17/5018* (2013.01); *G09B 23/32* (2013.01)

(58) Field of Classification Search
None
See application file for complete search history.

(56) References Cited

U.S. PATENT DOCUMENTS

2003/0171661 A1* 9/2003 Tong .................. A61B 5/04004
600/300
2007/0172797 A1 7/2007 Hada et al.
(Continued)

FOREIGN PATENT DOCUMENTS

EP 1 306 792 A2 5/2003
EP 1 782 733 A1 5/2007
(Continued)

OTHER PUBLICATIONS

Flynn, A Musculoskeletal Model of the Lower Limbs and its Application to Clinical Paediatric Orthopaedics, Sep. 2012, Queen's University, pp. 1-104.*
(Continued)

*Primary Examiner* — Omar F Fernandez Rivas
*Assistant Examiner* — Bernard E Cothran
(74) *Attorney, Agent, or Firm* — Hamilton, Brook, Smith & Reynolds, P.C.

(57) ABSTRACT

The present invention relates to a method and corresponding system for modeling a musculo-skeletal system. An embodiment of the method of the invention begins by scaling and positioning a musculo-skeletal model to correspond with motion capture data of a subject. Next, kinematically consistent motion data is generated from the motion capture data and then an inverse dynamic analysis of the musculo-skeletal model is performed using the generated kinematically consistent motion data, such that at least one analysis result is generated. The musculo-skeletal model is then updated to correspond with the at least one analysis result of the inverse dynamic analysis. Finally, the muscle activation of the updated musculo-skeletal model is optimized by determining at least one muscle force using the updated musculo-skeletal model, and by further updating the updated (Continued)

musculo-skeletal model to correspond with the determined at least one muscle force.

19 Claims, 13 Drawing Sheets

(56) References Cited

U.S. PATENT DOCUMENTS

| | | | | |
|---|---|---|---|---|
| 2007/0256494 | A1* | 11/2007 | Nakamura | A61B 5/224 73/379.01 |
| 2009/0082701 | A1* | 3/2009 | Zohar | A61B 5/103 600/595 |
| 2011/0112808 | A1* | 5/2011 | Anderson | G16H 50/50 703/2 |

FOREIGN PATENT DOCUMENTS

| | | |
|---|---|---|
| JP | 2003339673 A | 12/2003 |
| JP | 2006110217 A | 4/2006 |
| JP | 2007213015 A | 8/2007 |
| JP | 2007315968 A | 12/2007 |
| JP | 2009219557 A | 10/2009 |
| WO | 2005122900 A1 | 12/2005 |
| WO | 2006092872 A1 | 9/2006 |
| WO | WO 2006/138594 A2 | 12/2006 |
| WO | WO 2008/109248 A2 | 9/2008 |

OTHER PUBLICATIONS

Yahia-Cherif et al., Motion capture and visualization of the hip joint with Dynamic MRI and optical systems, 2004, University of Geneva, pp. 1-8.*

Saveh et al., Measurement of an intact knee kinematics using gait and fluoroscopic analysis, 2010, Springer-Verlag, pp. 267-272 (Year: 2010).*

Nadzadi et al., Kinematics, kinetics, and finite element analysis of commonplace maneuvers at risk for total hip dislocation, 2003, Elsevier, pp. 577-591 (Year: 2003).*

U.S. Food and Drug Administration, Fluoroscopy, 2018, U.S. Food and Drug Administration, pp. 1-10 (Year: 2018).*

Tak et al., A Physically-Based Motion Retargeting Filter, 2003, ACM, pp. 1-9 (Year: 2003).*

European Search Report, EP 14173613.2, "Musculo-Skeletal Modeling Using Finite Element Analysis, Process Integration, and Design Optimization,", dated Jan. 9, 2015.

Lee, Dongwoon, et al., "A Survey of Modeling and Simulation of Skeletal Muscle", *ACM Transaction of Graphics*, vol. 28, No. 4, pp. 1-12 (2009).

Lee, Sung-Hee, et al., "Comprehensive Biomechanical Modeling and Simulation of the Upper Body", *ACM Transaction of Graphics*, vol. 28, No. 4, pp. 1-17 (2009).

Saraswat, Prabhav, et al., "A musculoskeletal foot model for clinical gait analysis", *J. of Biomechanics*, vol. 43, No. 9, pp. 1645-1652 (2010).

Schiehlen, Werner, "Computational dynamics: theory and applications of multibody systems", *ScienceDirect, Eur. J. of Mech.*, vol. 25, No. 4, pp. 566-594 (2006).

Weisse, B., et al., "Determination of the Translation and Rotational Stiffnesses of an L4-L5 Functional Spinal Unit Using a Specimen-specific Finite Element Model," *Journal of the Mechanical Behavior of Biomedical Materials*, 13:45-61 (2012).

Delp, S. L., et al., "An Interactive Graphics-Based Model of the Lower Extremity to Study Orthopaedic Surgical Procedures," *IEEE Transactions on Biomedical Engineering*, 37(8):757-767 (1990).

Erdemir, A., et al., "Model-Based Estimation of Muscle Forces Exerted During Movements," *Clinical Biomechanics*, 22:131-154 (2007).

Rasmussen, J., et al., "A General Method for Scaling Musculo-Skeletal Models," *International Symposium on Computer Simulation in Biomechanics* (2005).

Crowninshield, R. D., "Use of Optimization Techniques to Predict Muscle Forces," *Transactions of the ASME*, 100:88-92 (1978).

Damsgaard, M., et al., "Analysis of Musculoskeletal Systems in the AnyBody Modeling System," *Simulation Modeling Practice and Theory*, 14:1100-1111 (2006).

Delp, S. L., et al., "A Computational Framework for Simulating and Analyzing Human and Animal Movement," *Computing in Science & Engineering*, pp. 46-55 (2000).

Adouni, M., et al., "Computational Biodynamics of Human Knee Joint in Gait: From Muscle Forces to Cartilage Stresses," *Journal of Biomechanics*, 45:2149-2156 (2012).

Andersen, M. S., et al., "Kinematic Analysis of Over-Determinate Biomechanical Systems," *Computer Methods in Biomechanical and Biomedical Engineering*, 12(4):371-384 (2009).

Chinnakonda, M., et al., "Generating Kinematically Consistent Data for Musculoskeletal Inverse Dynamic Analyses Using Finite Element Tools," American Society of Biomechanics, 2 pgs. (Sep. 2013).

Chinnakonda, M., et al., "Concurrent Determination of Musculoskeletal Dynamics and Soft Tissue Deformation using Finite Element Analysis Tools," *International Symposium Computer Methods in Biomechanics and Biomedical Engineering*, Amsterdam, the Netherlands, 26 pgs. (Oct. 2014).

Donahue, T. L.H., et al., "A Finite Element Model of the Human Knee Joint for the Study of Tibio-Femoral Contact," *J. Biomech. Eng.*, vol. 124, pp. 273-280, (Jun. 2002).

Leardini, A., et al., "Human movement analysis using stereophotogrammetry Part 3. Soft tissue artifact assessment and compensation," *Gait and Posture*, vol. 21, pp. 212-225 (2005).

Pioletti, D. P., et al., "Viscoelastic constitutive law in large deformations: application to human knee ligaments and tendons," *J. Biomech.*, vol. 31, pp. 753-757 (1998).

Quapp et al., "Material Characterization of Human Medial Collateral Ligament," *ASME J. Biomech. Eng.*, 22 pgs. (Oct. 27, 1997).

Shultz, R., et al., "Quantifying skin motion artifact error of the hindfoot and forefoot marker clusters with the optical tracking of a multi-segment foot model using single-plane fluoroscopy," *Gait & Posture*, vol. 34, pp. 44-48 (2011).

* cited by examiner

MUSCULO-SKELETAL MODELING USING FINITE ELEMENT ANALYSIS, PROCESS INTEGRATION, AND DESIGN OPTIMIZATION

BACKGROUND OF THE INVENTION

The invention generally relates to the field of computer programs and systems, and specifically to the field of computer-aided design (CAD), computer-aided engineering (CAE), modeling, and simulation.

A number of systems and programs are offered on the market for the design of parts or assemblies of parts, such as those provided under the trademark CATIA® and provided by Dassault Systemes, S.A. These so called CAD systems allow a user to construct and manipulate complex three-dimensional (3D) models of objects or assemblies of objects. CAD systems thus provide a representation of modeled objects using edges or lines, in certain cases with faces. Lines or edges may be represented in various manners, e.g. non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects—the typical size of a file representing an object in a CAD system ranges, but is typically on the Mega-byte order of magnitude for a part. An assembly may contain thousands of parts, and an assembly file is correspondingly large. A CAD system manages models of objects, which are stored in electronic files.

SUMMARY OF THE INVENTION

A method and corresponding system, according to an embodiment of the present invention are directed to generating a musculo-skeletal model. More specifically, an example embodiment of the invention provides finite element modeling of biological structures and provides outputs for detailed contact behavior and mechanical stresses in tissues.

An embodiment of the invention begins by scaling and positioning a musculo-skeletal model to correspond with motion capture data of a subject. Such an embodiment then generates kinematically consistent motion data from the aforementioned motion capture data. Next, an inverse dynamic analysis of the scaled and positioned musculo-skeletal model is performed using the generated kinematically consistent motion data, such that at least one analysis result is generated. The musculo-skeletal model is then updated to correspond with the at least one analysis result from the inverse dynamic analysis. Finally, the muscle activation of the updated musculo-skeletal model is optimized. According to an embodiment of the invention, this is accomplished by determining at least one muscle force using the updated musculo-skeletal model, and by further updating the musculo-skeletal model to correspond with the determined at least one muscle force.

An alternative embodiment of the method may further comprise generating the musculo-skeletal model before scaling and positioning, such a model may be considered a base musculo-skeletal model. According to a further embodiment of the present invention, generating the musculo-skeletal model may comprise at least one of: defining body segments, identifying muscle attachment points, adding bone geometry, defining joint connectors, defining muscle connectors, adding rigid body constraints, and adding markers.

In another example embodiment of the present invention, the at least one result of the inverse dynamic analysis comprises at least one of: a joint moment, a muscle length, a muscle moment arm, a muscle velocity, a muscle force at zero activation, and a muscle force at full activation. In yet another embodiment of the invention, the motion capture data is video data and the musculo-skeletal model is scaled and positioned using one or more frames of the motion capture data.

Another embodiment of the method according to the principles of the present invention is directed to hybrid modeling, such an embodiment comprises modifying at least one of the musculo-skeletal model, the updated musculo-skeletal model, and the further updated musculo-skeletal model to correspond with at least one of: deformable joint data, ligament data, and soft tissue data. An alternative embodiment, wherein the inverse dynamic analysis is non-linear, further comprises, before scaling and positioning, modifying the musculo-skeletal model to correspond with at least one of deformable joint data, ligament data, and soft tissue data. Yet further still, another example embodiment of the method of the present invention, wherein the at least one analysis result is a linear analysis result, further comprises, prior to optimizing the updated musculo-skeletal model: modifying the updated musculo-skeletal model to correspond with at least one of, deformable joint data, ligament data, and soft tissue data, scaling and positioning the modified musculo-skeletal model to correspond with the motion capture data of the subject, performing a non-linear inverse dynamic analysis of the modified musculo-skeletal model using the generated kinematically consistent motion data such that at least one non-linear analysis result is generated, updating the modified musculo-skeletal model to correspond with the at least one non-linear analysis result of the non-linear inverse dynamic analysis, and finally, optimizing the muscle activation using the updated modified musculo-skeletal model.

Yet another embodiment of the method wherein the at least one analysis result is a linear analysis result is directed to hybrid modeling. Such an embodiment further comprises: modifying the further updated musculo-skeletal model to correspond with at least one of deformable joint data, ligament data, and soft tissue data, scaling and positioning the modified musculo-skeletal model to correspond with the motion capture data of the subject, performing a non-linear inverse dynamic analysis of the modified musculo-skeletal model using the kinematically consistent motion data such that at least one non-linear analysis result is generated, updating the modified musculo-skeletal model to correspond with the at least one non-linear analysis result of the non-linear inverse dynamic analysis, and optimizing muscle activation of the updated modified musculo-skeletal model by determining at least one muscle force using the updated modified musculo-skeletal model and finally further updating the updated modified musculo-skeletal model to correspond with the determined at least one muscle force.

Another embodiment of the invention is directed to a system for generating a model of a musculo-skeletal system. An embodiment of the system according to the principles of the present invention comprises a scale and position module, a data filter module, an analysis module, an update module, and an optimization module. Alternative embodiments of the system may further comprise a model generation module and/or a hybrid analysis module. Embodiments of the system and its various components may be configured to operate according to any of the embodiments of the methods described herein.

Specifically, in an example embodiment, the scale and position module may be configured to scale and position a musculo-skeletal model to correspond with motion capture data of subject and the data filter module may be configured to generate kinematically consistent motion data from the motion capture data. In such an embodiment, the analysis module may be configured to perform an inverse dynamic analysis of the musculo-skeletal model using the generated kinematically consistent motion data, such that at least one analysis result is generated. Further, the update module may be configured to update the musculo-skeletal model to correspond with the at least one analysis result of the inverse dynamic analysis performed by the analysis module. In such an embodiment, the optimization module is configured to optimize muscle activation of the updated musculo-skeletal model by determining at least one muscle force using the updated musculo-skeletal model and further updating the updated musculo-skeletal model to correspond with the determined at least one muscle force.

The model generation module, according to an alternative embodiment of the system, may be configured to generate the musculo-skeletal model before the scale and position module scales and positions the musculo-skeletal model; this generated musculo-skeletal model may be considered a base musculo-skeletal model. According to an embodiment of the invention, the model generation module may be configured to generate the musculo-skeletal model by performing at least one of: defining body segments, identifying muscle attachment points, adding bone geometry, defining joint connecters, defining muscle connectors, adding rigid body constraints, and adding markers.

Yet another embodiment of the present invention is directed to a cloud computing implementation for generating a CAD model from a finite element mesh. Such an embodiment is directed to a computer program product executed by a server in communication across a network with one or more clients. The computer program product comprises a computer readable medium which comprises program instructions which, when executed by a processor causes scaling and positioning a musculo-skeletal model to correspond with motion capture data of a subject, generating kinematically consistent motion data from the motion capture data of the subject, performing an inverse dynamic analysis of the musculo-skeletal model using the generated kinematically consistent motion data such that at least one analysis result is generated, updating the musculo-skeletal model to correspond with the at least one analysis result of the inverse dynamic analysis, and optimizing muscle activation of the updated musculo-skeletal model by determining at least one muscle force using the updated musculo-skeletal model and further updating the updated musculo-skeletal model to correspond with the determined at least one muscle force.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
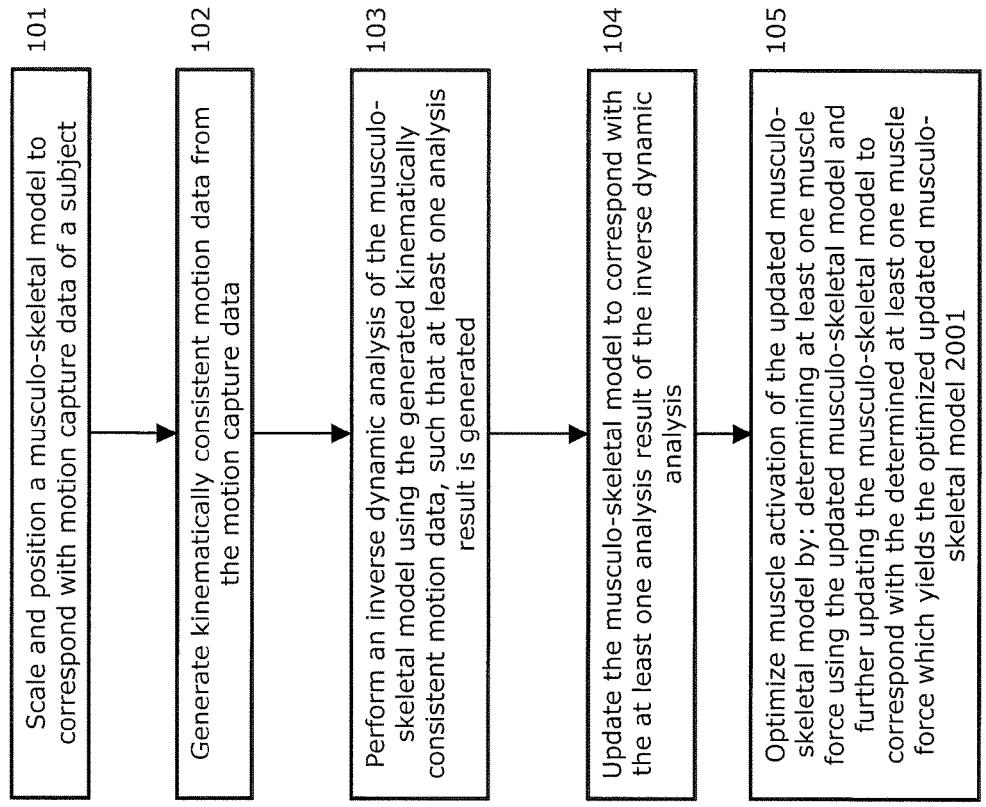
FIG. 1 is a flow chart depicting a method of modeling a musculo-skeletal system according to principles of the present invention.

The teachings of all patents, published applications and references cited herein are incorporated by reference in their entirety.

Musculo-skeletal modeling is used in numerous biomedical and clinical applications. Embodiments of the present invention relate to a numerical simulation to efficiently and accurately model inverse dynamics and muscle optimization of human motion. An embodiment of the invention leverages process integration tools to enable detailed finite element modeling of biological structures and provides reliable outputs for detailed contact behavior and mechanical stresses in tissues.

While methodologies for musculo-skeletal modeling exist, the available methods have several deficiencies. For example, many solutions lack the ability to model detailed joint behavior and use only idealized joints and predefined kinematics. Further, existing solutions are oftentimes constrained to a predefined workflow and do not allow for customization of the algorithms underlying the modeling methodology. In addition, existing solutions have limited use in industrial product development because they lack the ability to model detailed human/product interaction, e.g., design of an implanted knee with realistic materials and geometric based interactions during daily activities. Similarly, existing solutions do not have the ability to include detailed product design specifications in the modeling environment and many solutions do not support geometrical formats, such as .IGES. More generally, some of the existing solutions use oversimplified strategies and thus, fail to account for many of the mechanics related aspects associated with musculo-skeletal modeling. Further, existing solutions often attempt to perform detailed representations in an ad-hoc manner, which oftentimes yields an approach that is computationally expensive. These solutions fail to integrate detailed joint/product descriptions in the musculo-skeletal workflow in a realistic fashion.

Embodiments of the present invention address the shortcomings of existing solutions and provide methods and corresponding systems to model a musculo-skeletal system. An embodiment of the present invention includes the capability to model detailed joint behavior with realistic three-dimensional (3D) geometry, contact constraints, and tissue deformability. Further, embodiments of the present invention provide the flexibility to customize underlying algorithms and workflow sequences. An advantage of such an approach includes the capability to realistically model human interaction with products in an industrial product development setting that includes non-linear deformations and stress analysis (e.g., design of a prosthetic knee with realistic materials and geometric-based interactions during activities of daily living). Further, an embodiment of the invention may include in a user interface, detailed product design specifications to provide a rich modeling environment.

A description of example embodiments of the invention follows.

FIG. 1 is a flow diagram of a method 100 for generating a musculo-skeletal model 2001. The method 100 begins by scaling and positioning a musculo-skeletal model to correspond with motion capture data of a subject (101). According to an embodiment of the invention, the musculo-skeletal model may be a base musculo-skeletal model as described hereinbelow in relation to FIG. 2. Further, the process of scaling and positioning the musculo-skeletal may be done in accordance with the methods described hereinbelow in relation to FIGS. 3a and 3b. The next step in the method 100 is to generate kinematically consistent motion data from the motion capture data (102). The process for generating kinematically consistent motion data may be as described hereinbelow in relation to FIGS. 4a and 4b. Next, an inverse dynamic analysis of the musculo-skeletal model is performed using the kinematically consistent motion data such that at least one analysis result is generated (103). According to an embodiment of the invention, a non-exhaustive list of such possible results comprises: a joint moment, a muscle length, a muscle moment arm, a muscle velocity, a muscle force at zero activation, and a muscle force at full activation. In an embodiment of the method 100, the inverse dynamic analysis may be performed as described hereinbelow in relation to FIG. 5. The next step in the method 100 is to update the musculo-skeletal model to correspond with the at least one result of the inverse dynamic analysis (104). Finally, the muscle activation of the updated musculo-skeletal model is optimized by determining at least one muscle force using the updated musculo-skeletal model and further updating the musculo-skeletal model to correspond with the determined at least one muscle force (105). According to an embodiment of the method 100, the process of optimizing muscle activation may be as described hereinbelow in relation to FIG. 7.

Further, the steps 101-105 of the method 100 may be carried out as described in Saraswat et al., *Results Repeatability of Right Leg Finite Element Based Musculoskeletal Modeling*, International Society of Biomechanics, Brazil (August 2013), the contents of which are herein incorporated by reference.

According to an embodiment of the invention, the musculo-skeletal modeling method 100 may be implemented using, for example, the process integration framework provided with the software package Isight provided by Dassault Systemes Simulia Corp. In such an embodiment of the method 100, Isight enables integration of the individual steps 101-105. Further, as described hereinabove, the steps 102-105 individually may receive as inputs, numerical data computed or post-processed in the respective preceding steps, 101-104. In an embodiment of the method 100, the first step, 101 of the method 100, however, may receive data input from an external source, for example, as described herein, motion capture data of a subject.

As described hereinabove, the method 100 begins with scaling and positioning a musculo-skeletal model to correspond with motion capture data (101). The motion capture data may be collected according to any method as is known in the art. For example, motion capture cameras, such as Oqus cameras provided by Qualisys Motion Capture Systems, may be used to record the spatial position of reflective markers on bony landmarks of a subject. Any number of motion capture cameras may be used, such as twelve, and the basis for selecting this number is known by those in the art. The placement of the reflective markers may be done in accordance with principles known in the art. For example, if one were collecting motion capture data of a leg, then segments of the leg, e.g., the pelvis, thigh, shank, and foot, may each have three to four markers placed thereon. Further, ground reaction force (GRF) may be recorded using any method as is known in the art, such as through use of force plates embedded in the floor.

An embodiment of the method 100 may further comprise importing the motion capture data. In an example workflow of the method 100, the motion capture data may be imported into, for example, an Abaqus analysis module provided by Dassault Systemes Simulia Corp. Further, according to an embodiment of the present invention, the motion capture data may be processed into a format that can be used with an analysis tool after it is collected. For example, where the motion capture data is being imported into Abaqus, the data may be converted into the C3D format.

Figure 2:
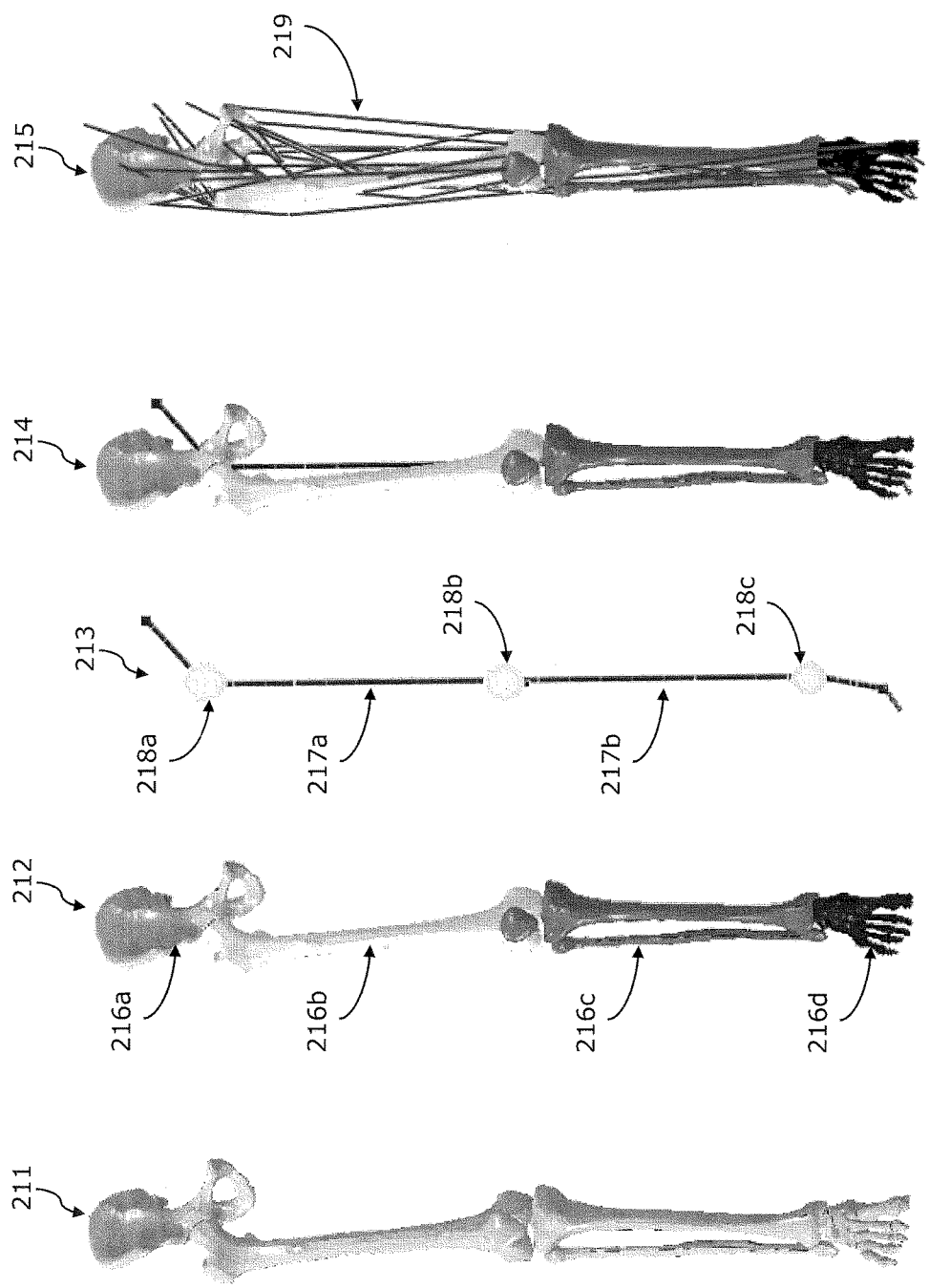
FIG. 2 depicts a musculo-skeletal model at various stages of being generated.

FIG. 2 illustrates a musculo-skeletal model at various stages of generation. Specifically, FIG. 2 illustrates the stages of generating a base model according to an embodiment of the invention. As described above, the method 100 begins by scaling and positioning a musculo-skeletal model to correspond with motion capture data of a subject (101). Thus, an example embodiment of the method 100 further comprises generating this initial musculo-skeletal model that is scaled and positioned at step 101 of the method 100. FIG. 2 illustrates various stages of generating a base model of a right leg according to the principles of the present invention. A similar process may be used for other regions of the body for which it is desired to generate a musculo-skeletal model. The process begins with right leg 211. The right leg 211 is then divided into rigid segments 216a-d. In the example depicted in FIG. 2, the right leg 212 is partitioned into rigid segments of the pelvis 216a, thigh 216b, shank 216c, and foot 216d. Next, a stick figure 213 is created. The stick figure 213 is created with reference points at the center of mass of the segments. The stick figure 213 is developed with axial connectors, such as the axial connectors 217a and 217b and joints, such as the joints 218a-c. The joints may be modeled according to any method as is known in the art. For example, as join-cardan connectors. A display body of the bone geometry is then added to the stick figure 213 as depicted in the model 214. Finally, the muscles 219 (representations thereof) are added to create the base model 215. The base model 215 may comprise any number of muscles, for example, in a base model of the human right leg, the model may comprise 43 muscles spanning the hip, knee, and ankle joints. In developing this base model 215, muscle insertion coordinates and muscle parameters may be taken from literature as is known in the art. Elements of developing the base model, through the depicted stages, 211 through 215 may comprise: defining body segments, adding muscle attachment points, adding bone geometry, defining joint connectors, defining muscle connectors, adding rigid body constraints, and adding markers.

Figure 3A:
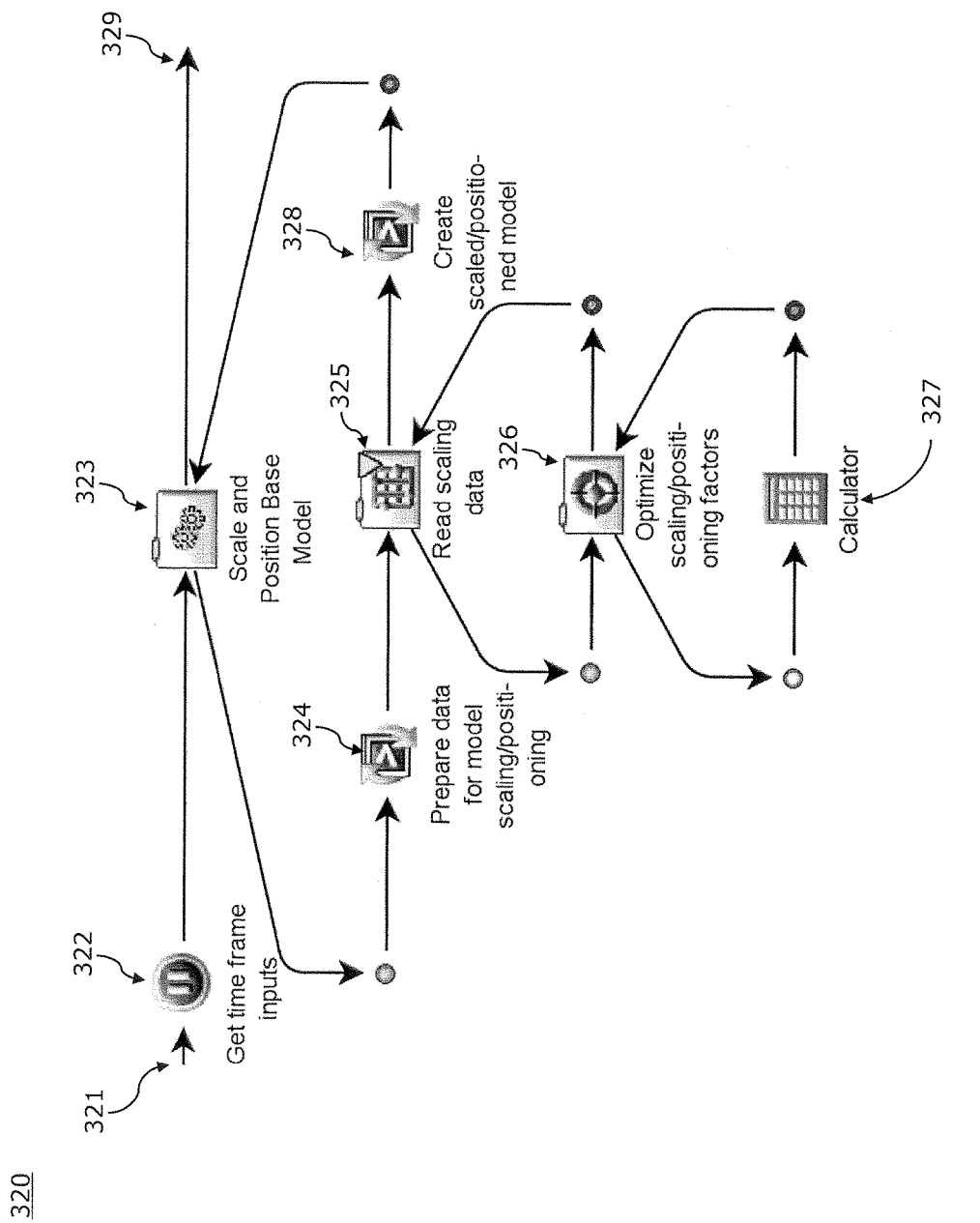
FIG. 3a is a flow chart depicting a method of scaling and positioning a musculo-skeletal model according to an embodiment of the invention.

FIG. 3a is a flow chart depicting a method 320 of scaling and positioning a musculo-skeletal model according to an embodiment of the invention. Step 101 of the method 100 may be carried out in accordance with the method 320. The method 320 begins 321 with an input. This input may be a musculo-skeletal base model and motion capture data as described hereinabove. Next, time frame inputs are attained to crop the motion capture data for one activity cycle (322). The method 320 then proceeds to the process 323 of scaling and positioning the base model. First, the data is prepared for model scaling and positioning (324). This may include any data formatting or other pre-processing as is known in the art. Next, the scaling data is read (325). The scaling data may be read from the output of the step 324 of the method 320. After reading the scaling data (325), the scaling and positioning factors are optimized 326, through calculator 327. The calculator 327, may evaluate a solution of scaling and positioning matrices resulting from optimizing scaling and positioning factors (326), and provide feedback to optimize the scaling and positioning factors (326). The read scaling data (325), and the optimized scaling and positioning factors (326) are then used at step 328 to create the scaled and positioned model. After creating the scaled and positioned model (328), the method may end by outputting the scaled and positioned model to the next process of developing a musculo-skeletal model (329).

The method 320 of scaling and positioning the base model may be accomplished according to any method as is known in the art. For example, according an example embodiment of the present invention, the optimization module may be used to compute the scaling and transformation matrices, which are used to scale and position the base model. The process 326 of optimizing the scaling and positioning factors may be optimized according to any number of considerations as are known in the art. For example, in an embodiment of the present invention wherein a musculo-skeletal model of the right leg is being generated, the objective function may be to minimize the least squares error of marker coordinates while hinge constraints are applied at the hip, knee, and ankle joints. Further, motion capture data in any form may be used in scaling and positioning the base model. For example, where the motion capture data is video data, one or more frames from the this video motion capture data may be used.

Figure 3B:
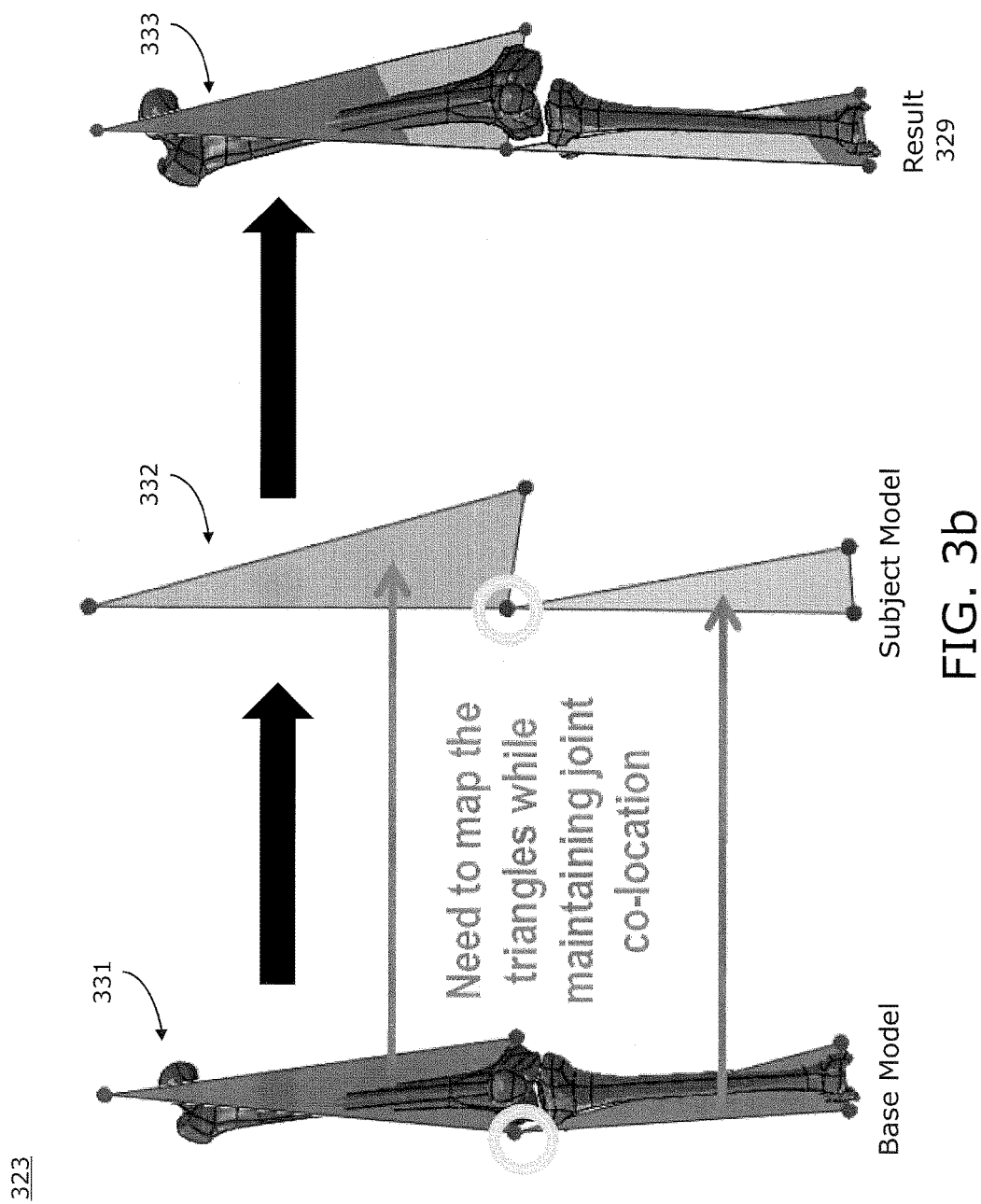
FIG. 3b is a visual depiction of scaling and positioning a base musculo-skeletal model to correspond with a subject model according to the principles of the present invention.

FIG. 3b is a visual depiction of a process 323 of scaling and positioning a base musculo-skeletal model to correspond with a subject model according to the principles of an embodiment of the present invention. The scaling and positioning process 323 begins with the base model 331. The base model 331 may be any musculo-skeletal model as is known in the art and may be generated according to any of the methods described herein. According to an embodiment of the invention, a goal of scaling and positioning the musculo-skeletal model is to map the triangles as depicted in step 331 and 332 of FIG. 3b, while maintaining joint co-location. The triangles depicted in step 331 of the process 323 may represent a base model, while the triangles depicted in step 332 may be representative of a subject model and be derived from motion capture data as described hereinabove. The method 330 begins with a base model 331, and using a subject model 332, maps the respective models while maintaining joint co-location which yields the scaled and positioned musculo-skeletal model 329 depicted in step 333 of the scaling and positioning process 323.

Figure 4A:
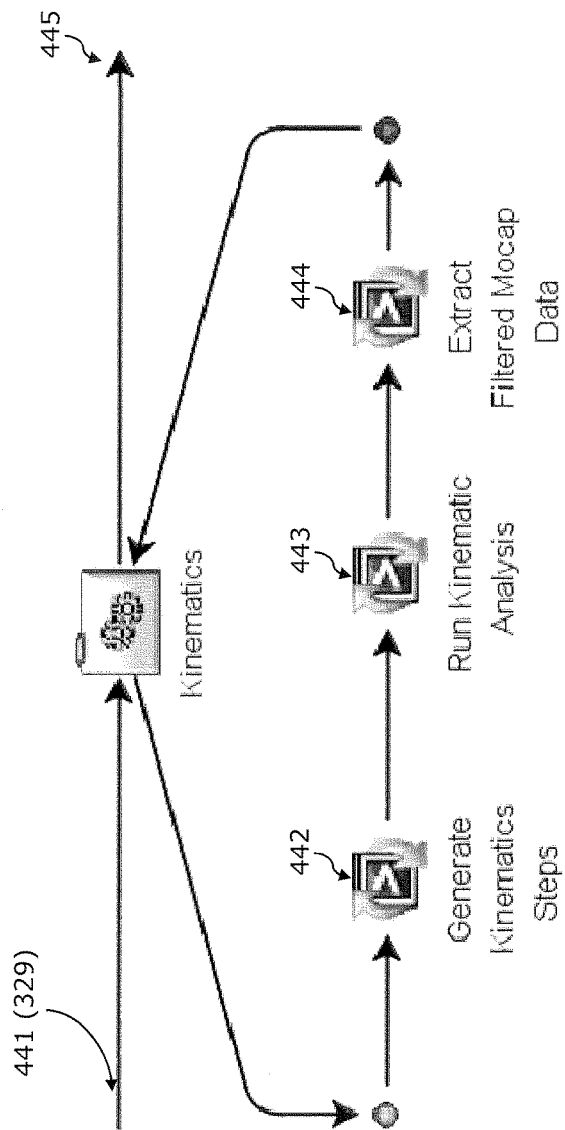
FIG. 4a is a flow chart depicting a method of generating kinematically consistent motion data according to the principles of an embodiment of the present invention.

FIG. 4a is a flow chart depicting a method 440 of generating kinematically consistent motion data according to the principles of an embodiment of the present invention. The method 440 may be implemented in step 102 of the method 100 described hereinabove in relation to FIG. 1.

Motion capture data recorded using reflective markers, as described hereinabove, can be noisy and can be affected by skin artifacts and/or tracking errors. Thus, according to an example embodiment of the present invention, this motion capture data is corrected to produce kinematically consistent motion data. The method 440 may begin with an input (441), which may be motion capture data and/or a musculo-skeletal model scaled and positioned to correspond with the motion capture data of a subject. This input 441 may be the output 329 from the method 320 described hereinabove in relation to FIG. 3a. Next, load steps are created (442). For example, in an embodiment of the invention implemented using Abaqus, the step 442 of the method 440 may comprise creating steps for Abaqus analysis. After load steps are created 442, kinematic analysis with distributed coupling and shell elements is performed (443) to remove kinematical inconsistency. In an example embodiment of the invention, the step 443 of the method 440 may be performed using Abaqus. Finally, the filtered motion capture data is extracted (444). The method 440 may further comprise outputting the generated kinematically consistent motion data (445). Further, according to an embodiment of the present invention, the process for generating kinematically consistent motion data may be as given by Chinnakonda et al., *Generating Kinematically Consistent Data For Musculoskeletal Inverse Dynamic Analyses Using Finite Element Tools*, American Society of Biomechanics (September 2013) which is herein incorporated by reference in its entirety.

Figure 4B:
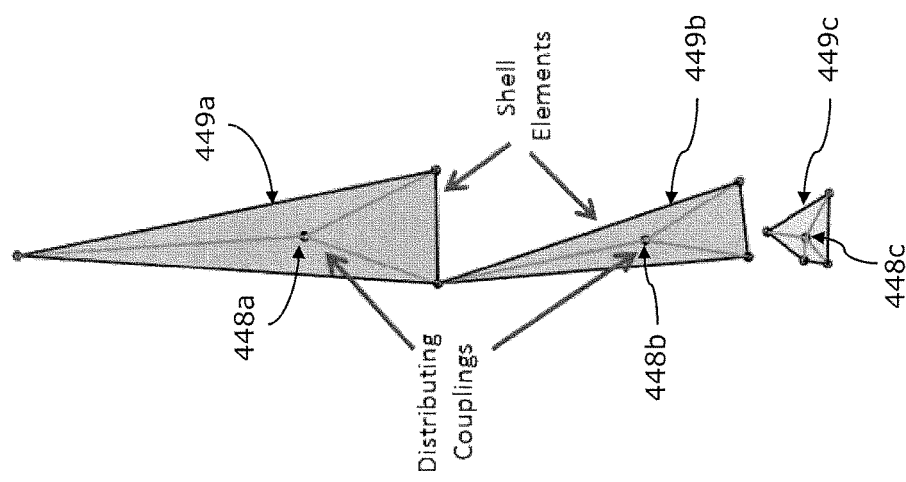
FIG. 4b is a visual depiction of one of the models used to generate kinematically consistent motion data according to an embodiment of the invention.

FIG. 4b is a visual depiction 447 of a model used to generate kinematically consistent motion data according to an example embodiment of the invention, wherein kinematically consistent motion data is generated from motion capture data of the right leg of a human subject. The model 447 is a finite element model, constructed with markers from the motion capture data represented as nodes defined at their initial recorded coordinates. Shell elements 449a-c are defined connecting three to four nodes designated per body segment and in turn each of these elements 449a-c, are coupled to reference nodes located at the segment center of masses through distributed coupling constraints 448a-c.

In an example embodiment of the present invention, motion of 3 to 4 markers on each leg segment is reduced to an equivalent 6 degree of freedom motion (3 translations and 3 rotations for each body segment, which may be represented by the shell elements 449a-c). In an embodiment of the invention this may be carried out using a combination of the shell elements 449a-c and the distributed couplings 448a-c features, such as those provided in Abaqus, that also serve as a filter for skin motion artifacts in the motion capture data.

In an example embodiment of the present invention a three step process may be used to generate kinematically consistent motion data. First, a finite element model is constructed with markers represented as nodes defined at their initial recorded coordinates. Shell elements are defined connecting 3 to 4 nodes designated per body segment and in turn each of these elements are coupled to reference nodes located at the segment center of masses through distributing coupling constraints. Further, a finite element analysis is performed wherein the motion of the marker points are prescribed through three translational degrees-of-freedom (DOF) coming from motion capture data. The shell elements along with the distributed coupling constraints are utilized in computing an averaged motion (6 DOF) for each body segment at the coupling reference nodes based on translations available at each of the markers. The next step in the process utilizes a subject specific musculo-skeletal model, which may be the scaled and positioned musculo-skeletal model as described hereinabove, which comprises rigid body segments connected by joints and spanned by muscles which may be developed in, for example, Abaqus/CAE. The reference nodes of the rigid bodies located at the center of masses of the segments are each attached with Cartesian-Cardan connectors (elements that model discrete point-to-point physical connections) with specified translational and rotational stiffness. Finally, motion recorded (6 DOF), which may be the motion capture data as described hereinabove, at the reference nodes of distributing coupling constrains as described in the first step, are used to drive the end points of the Cartesian-Cardan connectors. These connectors, which act as stiff springs in such an implementation, alleviate kinematic inconsistency in the musculo-skeletal model producing filtered data, which can be used for further processing. Further, as is known to one of ordinary skill in the art, stiffness values of the connectors as described hereinabove, can be used as weight factor to control the segments for which the motion data should be closely followed.

Figure 5:
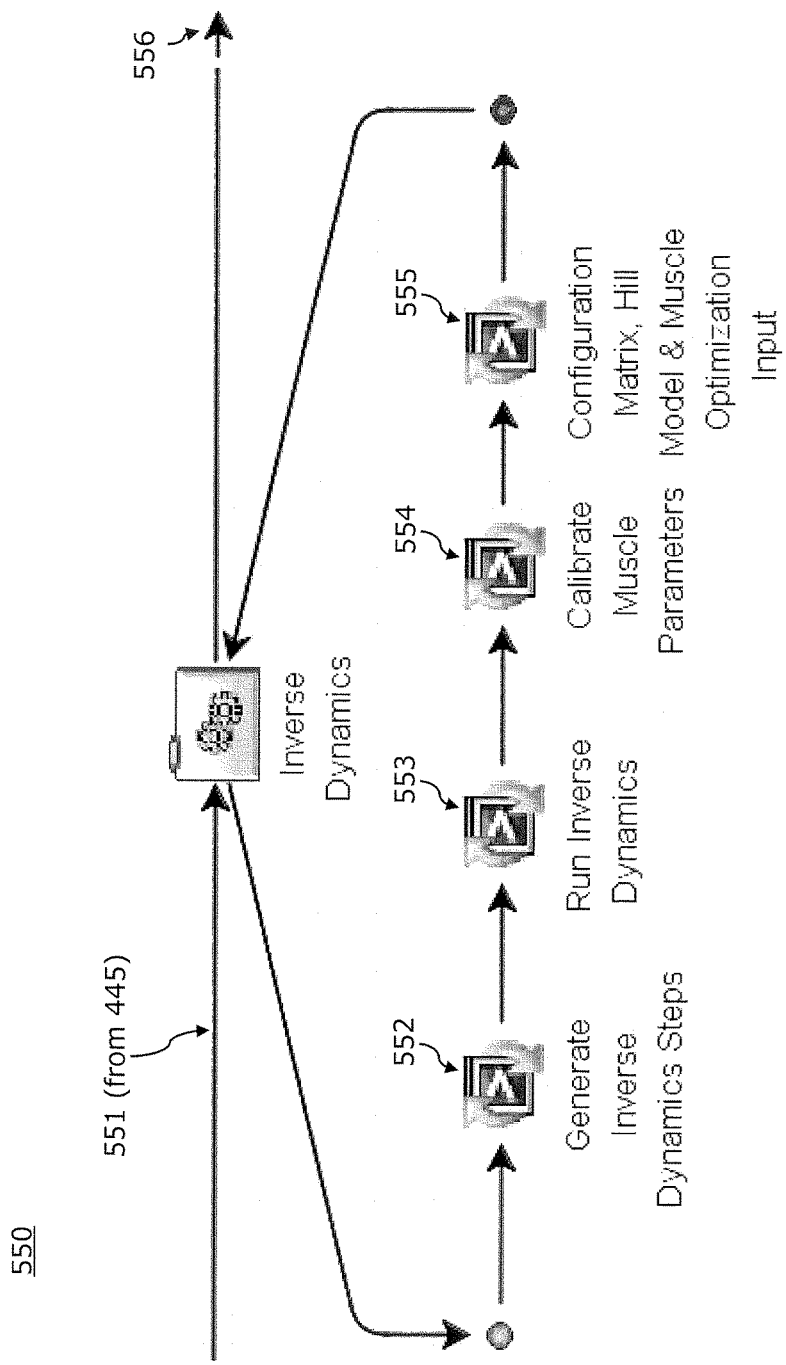
FIG. 5 is a flow chart depicting a method of performing an inverse dynamic analysis according to principles of an embodiment of the invention.

FIG. 5 is a flow chart depicting an inverse dynamic analysis method 550 according to principles of an embodiment of the invention. The method 550 may be used in step 103 of the method 100 described hereinabove. The method 550 begins with an input of motion data (551). This motion data may be the kinematically consistent motion data generated from the method 440 of FIG. 4a which is outputted in step 445 described above. Next, inverse dynamic analysis steps are generated (552). Following, the generation of the inverse dynamic analysis steps (552), the inverse dynamic analysis is performed (553). According to an embodiment of the invention, an analysis, such as one performed by Abaqus, may be used to perform or execute the inverse dynamic analysis (553). In such an example embodiment of the invention wherein the human leg is being modeled, the analysis drives the model, which may be the scaled and positioned model 329 (FIGS. 3a and 3b), by the generated kinematically consistent motion data, 445, 551, and applies ground reaction force on the foot as a time dependent load. After, running the inverse dynamic analysis (553), one or more resulting muscle parameters may be calibrated (554). Finally, a configuration matrix, Hill Muscle Model, and Optimization Input are determined (555). One or more of these results may then be outputted (556).

According to an embodiment of the invention, one or more analysis results, 556, from the inverse dynamic analysis method 550 (or equivalently 103 in FIG. 1) comprise: joint moments, muscle lengths, muscle moment arms, and muscle velocities. One or more of these results 556 may be used in developing a Hill Muscle Model as described hereinbelow in relation to FIG. 6.

Figure 6:
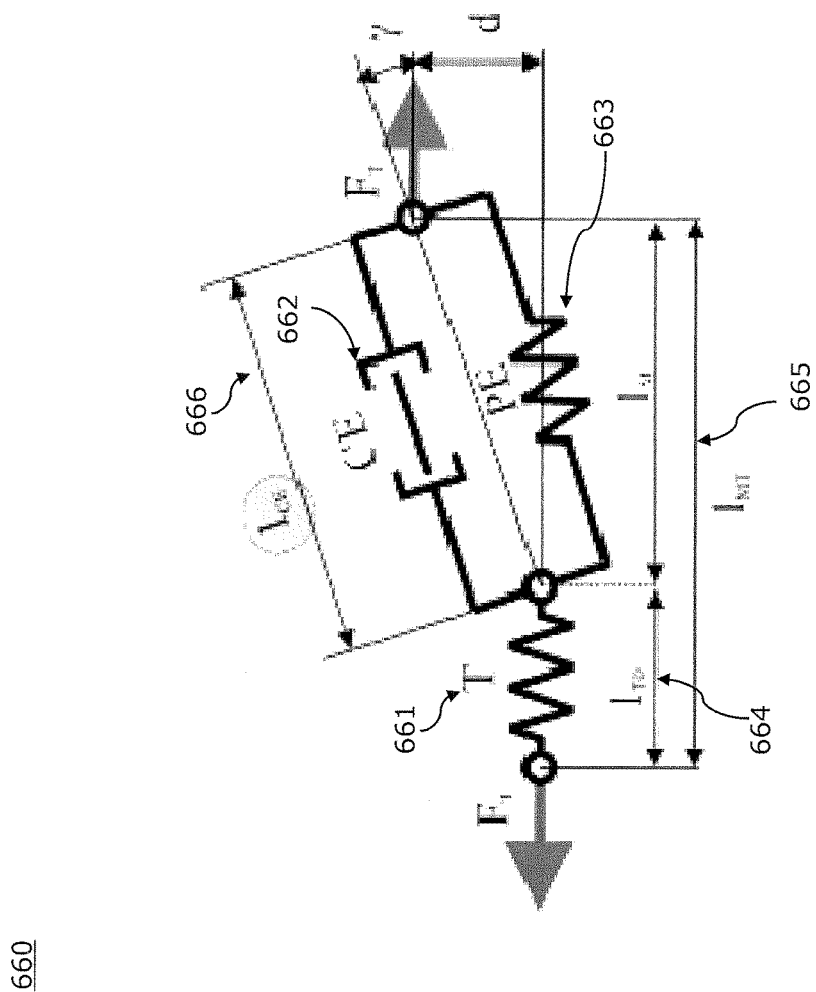
FIG. 6 is a visual representation of the Hill Muscle Model that may be utilized in an embodiment of the invention.

FIG. 6 is a representation of the Hill Muscle Model 660 that may be utilized in step 104 of FIG. 1 in an embodiment of the invention to update the musculo-skeletal model. The Hill Muscle Model 660 provides a numerical approach to characterize muscle behavior based on muscle length and velocity. As described hereinabove, the muscle length and velocity data may result from the inverse dynamic analysis (generally method 550) described hereinabove in relation to FIG. 5. The Hill Muscle Model 660 comprises a tendon element 661, a contractile element 662, and a passive element 663. These components of the Hill Muscle Model 660 may be developed in terms of the tendon length 664, muscle length 666, and the tendon-muscle length 665. According to an embodiment of the invention, the range of muscle lengths from the inverse dynamic analysis described hereinabove in relation to FIG. 5 may be used to calibrate the Hill Muscle Model parameters (fiber length, tendon length) in order to develop a subject specific muscle model.

According to an example embodiment of the invention, the contribution of each muscle of the musculo-skeletal model to joint moments may be computed by a computer script that calculates moment arms of each muscle with respect to joint centers. The computer script used may be developed using any computer programming language as is known in the art, such as Python. This determined moment arm information may be saved in the configuration matrix 555 of FIG. 5 and used as input for the muscle activation optimization method 770 described hereinbelow in relation to FIG. 7. In an alternative embodiment of the invention, a configuration matrix 555 that allows for deformable body segments may be computed using a perturbation based procedure implemented using Abaqus, for example. In yet another embodiment of the invention, the configuration matrix 555 may represent the reaction moment at a joint due to unit force in muscle.

Figure 7:
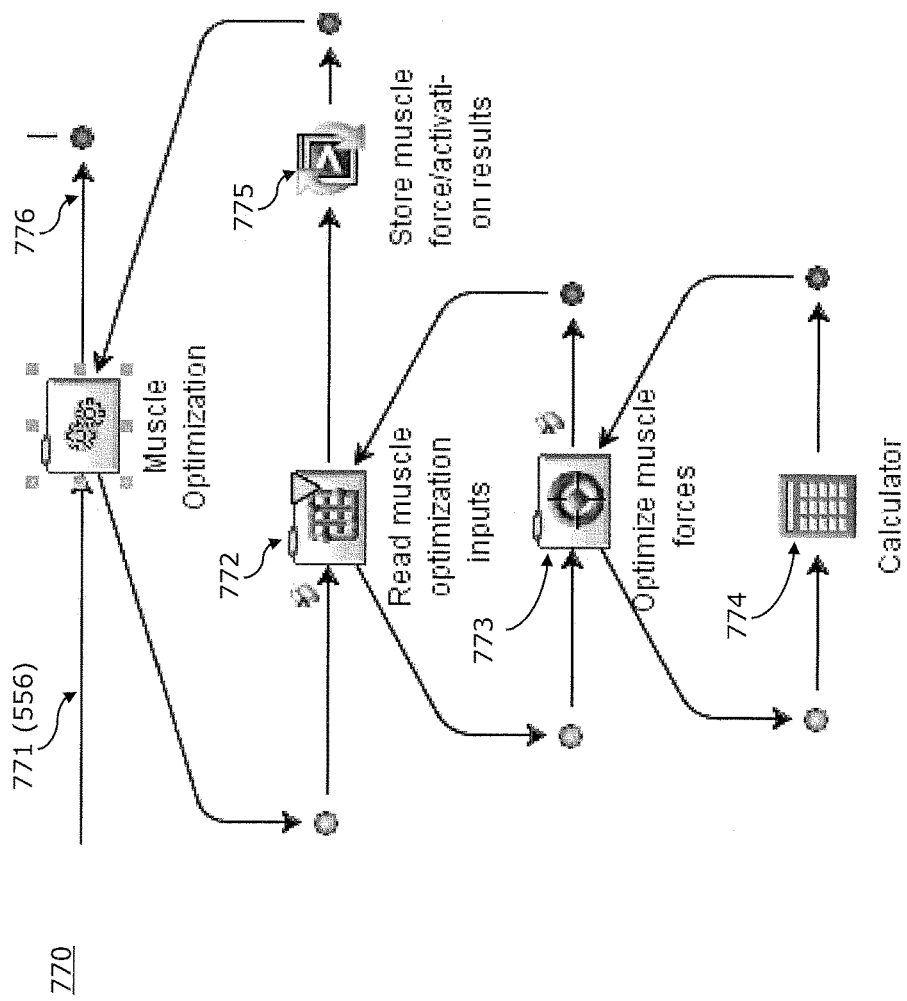
FIG. 7 is a flow chart that depicts a method of muscle optimization according to an embodiment of the invention.

FIG. 7 is a flow chart that depicts a method 770 of muscle activation optimization according to an embodiment of the invention. Muscle activation optimization method 770 implements step 105 of FIG. 1. The method 770 begins with input (771), the input may be one or more results 556 from the inverse dynamic analysis method 550 of FIG. 5. Next, the one or more muscle optimization inputs 771 are read (772). Following reading the muscle optimization inputs at step 772, the muscle forces are optimized (773), via calculator (774). Particularly, according to an embodiment of the invention, the calculator 774 evaluates a solution of muscle activations and provides feedback for optimization 773. After the muscle forces are optimized (773), this information may be stored (775). The muscle activation optimization method 770 may then end (776). Further, according to an alternative embodiment of the invention, after the muscle forces are optimized (by method 770 of FIG. 7, or step 105 of FIG. 1 generally), this resulting musculo-skeletal model, 2001, is output and used in a hybrid modeling embodiment as described hereinbelow.

As described hereinabove, a three-component Hill Muscle Model 660 may be implemented using a computer script that uses the muscle length 666 and muscle velocity as input and computes passive force (at zero activation) and maximal force (at full activation) as output. An optimization module, such as one used by Isight, may be used to estimate muscle activation level. According to an embodiment of the invention, the optimization function for muscles may be given by the following equation: $\beta = \Sigma a^p$, p=3. In an embodiment of the invention an objective function is to minimize the cubic sum of activations, as given by the aforementioned equation, subject to constraints including positive muscle force and moment equilibrium equations for each joint. The equilibrium equation for joints may be given by: $CRM=\Sigma T*a*MF(l,v)$ wherein CRM is joint moment computed in the kinematic analysis, T is joint moment generated by unit force in the muscle, a is the activation level of muscle, and MF is maximum muscle force as a function of muscle length and velocity. Other objective functions may be implemented in the workflow as is known in the art.

The above described method and various embodiments thereof, provide a musculo-skeletal modeling methodology. Such an embodiment may involve generating a base model with muscle and body segment definitions. Motion data that was collected in a motion capture lab with reflective markers on bony landmarks of human subjects may then be used to drive the musculo-skeletal model. According to such an embodiment, a base computer human model is then scaled and positioned to match the first frame of the motion capture data. The scaled and positioned model is then driven kinematically by the trajectories of marker data. Inverse dynamics and muscle activation optimization are then performed to compute muscle activation patterns for an activity. A realistic and accurate musculo-skeletal model 2001 results.

The various embodiments of the invention may be implemented using an Isight workflow to automate the overall musculo-skeletal modeling process 100 using Abaqus-based inverse dynamic analysis (550 generally), python scripts (Hill muscle model 660) and optimization (scaling, positioning and muscle activation 320, 770) modules. However, the invention is not limited to implementations using these or any other known products. In its simplest form, this workflow may use rigid body dynamics and simplified joint representations. In its more general form, it may include realistic deformable joints as well as human model interaction with products.

Figure 8:
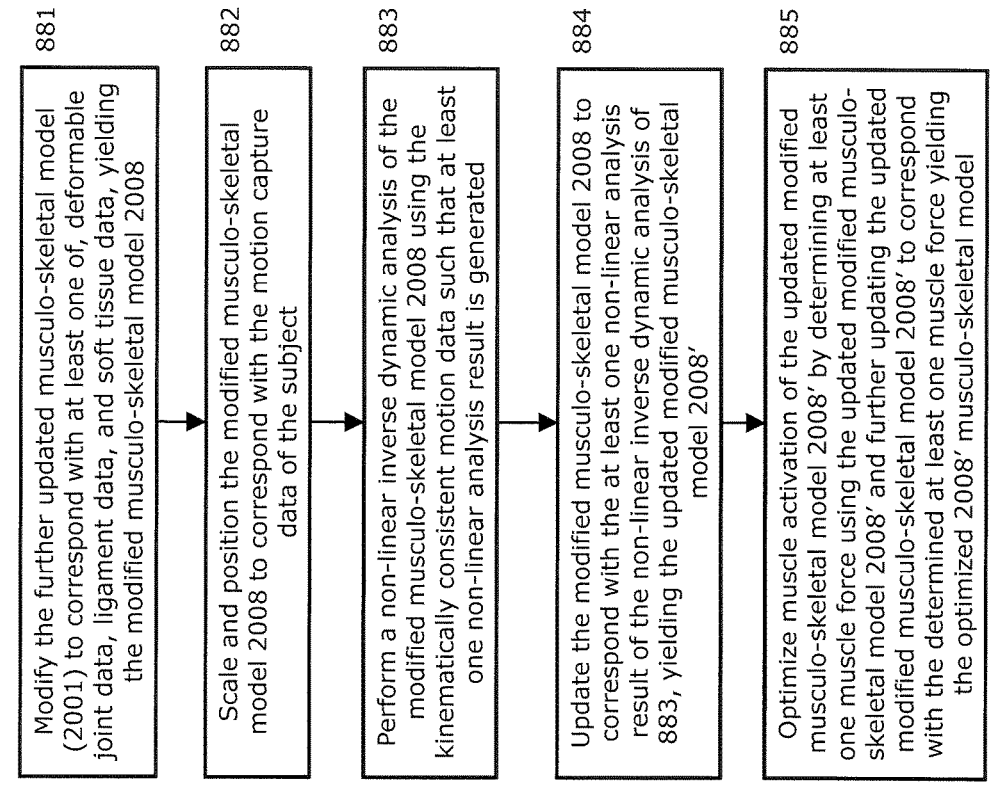
FIG. 8 is flow chart depicting a method of hybrid modeling according to an embodiment of the invention.

FIG. 8 is flow chart depicting a computer implemented method 880 of hybrid modeling according to an embodiment of the invention. Hybrid modeling uses a non-linear finite element based musculo-skeletal workflow that replaces simplified joint constraints with realistic three-dimensional (3D) representations for the deformable joints, ligaments, and soft tissues when such data is available. Realistic simulation of function units of musculo-skeletal structures often requires capturing complicated contact and deformation of biological tissues in a computationally efficient manner. Specifically, the complexities include contacts in orthopedic joints, restraints of ligaments, as well as realistic material properties for soft tissues. In an embodiment of the invention, an inverse dynamics analysis component (550 of FIG. 5), such as one provided in Abaqus, is augmented, using Isight for example, to include the finite element model of the deformable joints with ligaments, cartilage contacts, and biofidelic tissue behaviors.

Hybrid modeling, may be used to develop musculo-skeletal models for even highly complicated elements, for example, the knee and the spine joints. Further detail on modeling the spine joint according to the principles of the present invention are given in Yao et al., *A Computationally Efficient And Accurate Lumbar Spine Model*, Proceeding of the ASME 2013 Summer Bioengineering Conference, Omaha, Nebr. (September 2013), the contents of which are herein incorporated by reference.

FIG. 8 illustrates a method 880 of performing hybrid modeling according to the principles of the present invention after the muscle activation of the musculo-skeletal model 2001 has been optimized, according to the musculo-skeletal modeling method 100 described hereinabove in relation to FIG. 1. The method 880 begins by modifying the further updated musculo-skeletal model 2001 to correspond with at least one of, deformable joint data, ligament data, and soft tissue data (881). In an embodiment of the invention, the further updated musculo-skeletal model 2001 is the musculo-skeletal model updated in step 105 of the method 100 described in FIG. 1. Next, the modified musculo-skeletal model 2008 (output resulting from step 881) is scaled and positioned to correspond with the motion capture data of the subject (882). After step 882 scales and positions the modified musculo-skeletal model 2008, a non-linear inverse dynamic analysis of the modified musculo-skeletal model 2008 is performed using the kinematically consistent motion data such that at least one non-linear analysis result is generated (883). The modified musculo-skeletal model 2008 is then updated to correspond with the at least one non-linear analysis result of the non-linear inverse dynamic analysis (884). Finally, the method 880 concludes with optimizing the muscle activation of the updated modified musculo-skeletal model 2008' (output from step 884) by determining at least one muscle force using the updated modified musculo-skeletal model 2008' and further updating the updated modified musculo-skeletal model 2008' to correspond with the determined at least one muscle force (885).

According to an embodiment of the invention, the method 880 and its various steps 881-885 may be accomplished through the various means and methods described herein. As described hereinabove, the method 880 performs a hybrid modeling analysis after performing the method 100. However, according to an alternative embodiment of the present invention, the method 100 may be modified to perform hybrid-modeling from the outset. In such an embodiment, prior to scaling and positioning (101), the musculo-skeletal model is modified to correspond with at least one of deformable joint data, ligament data, and soft tissue data, and the inverse dynamic analysis performed at step 103 is non-linear.

In yet another embodiment of the invention, before optimizing the muscle activation of the updated musculo-skeletal model (105), the updated musculo-skeletal model is modified to correspond with at least one of deformable joint data, ligament data, and soft tissue data. Then the modified musculo-skeletal model is scaled and positioned to correspond with the motion capture data of the subject, a non-linear inverse dynamic analysis using the modified musculo-skeletal model is performed, and the modified musculo-skeletal model is updated to correspond with at least one result of the non-linear inverse dynamic analysis. Finally, the muscle activation is optimized using the updated modified musculo-skeletal model.

Figure 9:
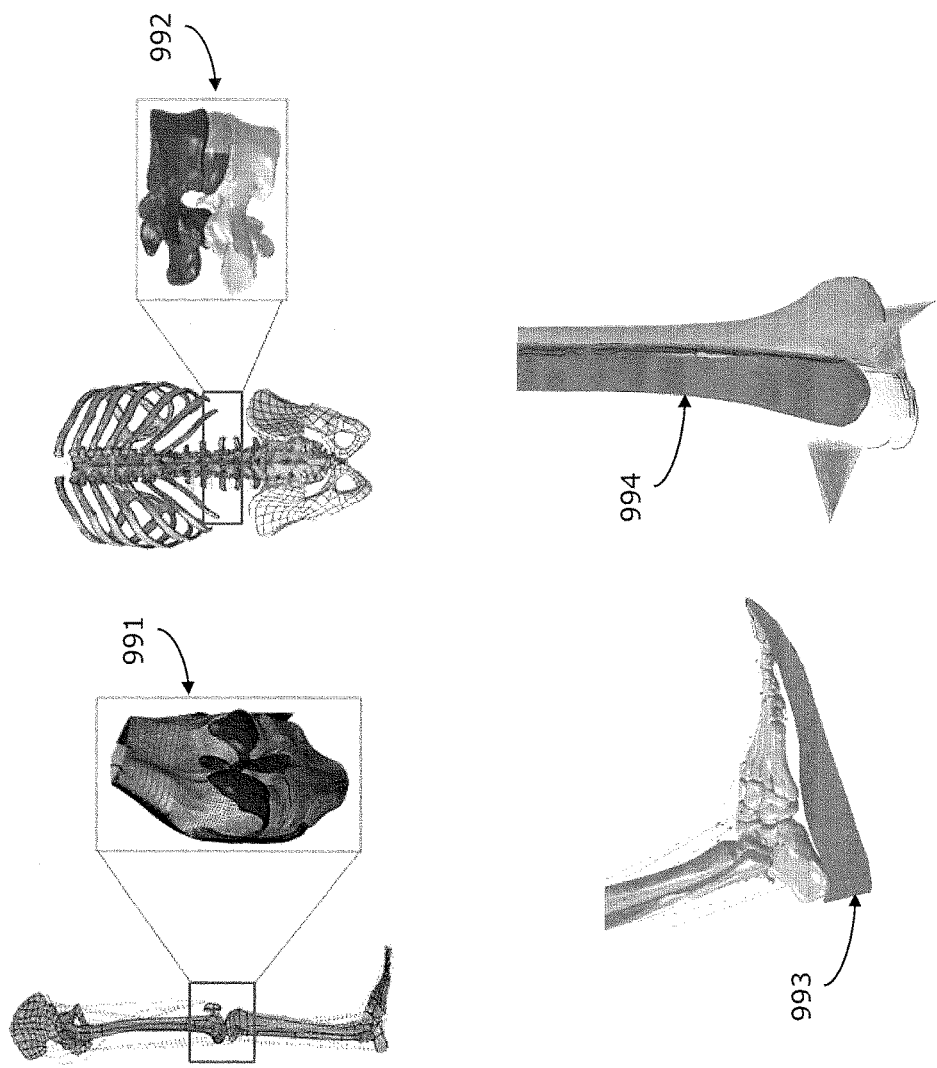
FIG. 9 is a visual depiction of various aspects of hybrid modeling according to one or more embodiments of the invention

FIG. 9 depicts various aspects of hybrid modeling according to an embodiment of the present invention. As described hereinabove an embodiment of the present invention comprises modifying a musculo-skeletal model to correspond with at least one of deformable joint data, ligament data, and soft tissue data. This is depicted in FIG. 9 with regards to embodiments of the invention modeling the human knee 991, and the spine 992. Further, as described herein, embodiments of the invention may be used to accurately model human product interactions. Such embodiments, may be used to model such things as footwear 993 and tibial fixation plates 994 as shown in FIG. 9.

Figure 10:
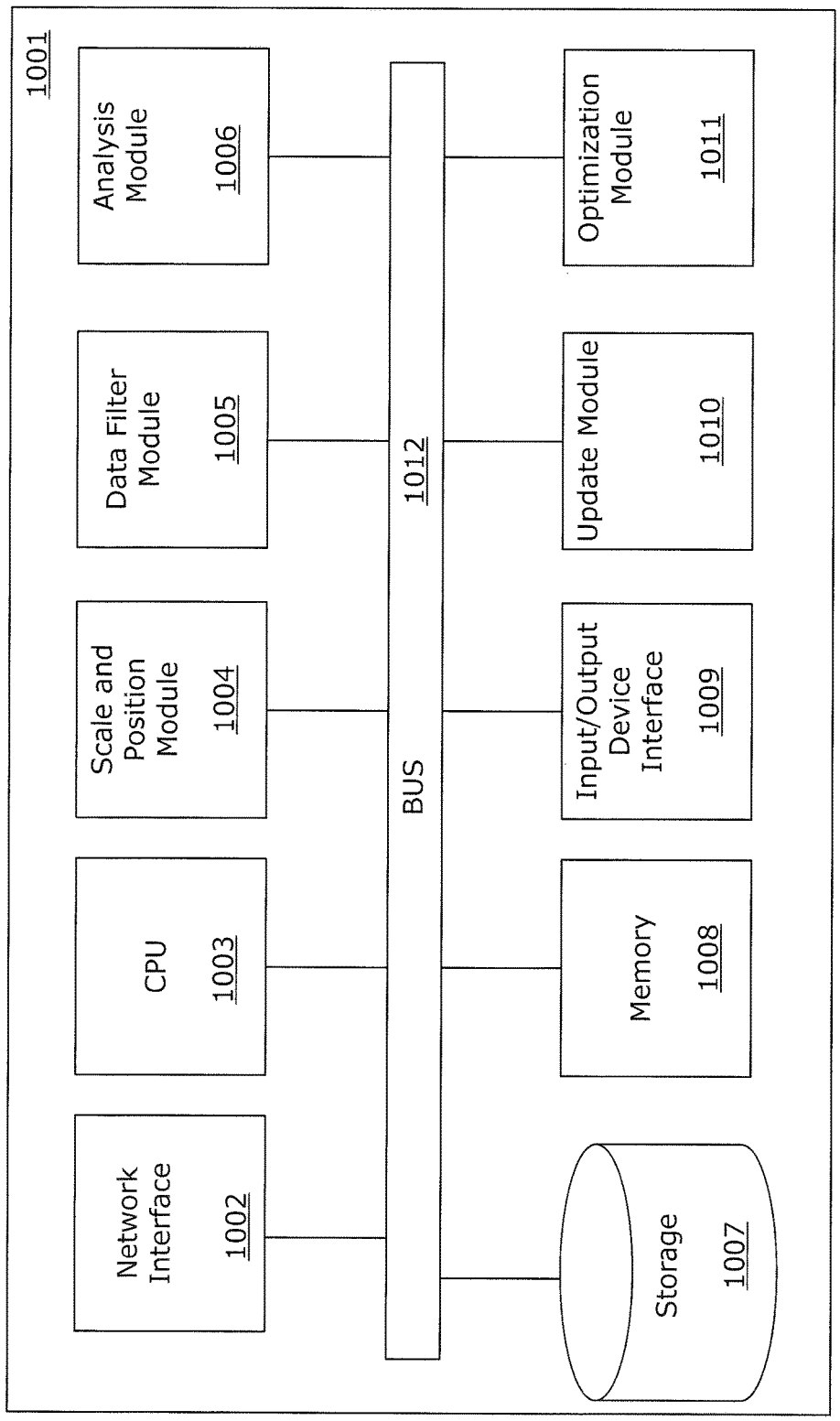
FIG. 10 is a simplified block diagram of a system for generating a model of a musculo-skeletal system.

FIG. 10 is a high level block diagram of a system 1001 for generating a model of a musculo-skeletal system according to the principles of the present invention. The system 1001 contains a bus 1012. The bus 1012 is a connection between the various components of the system 1001. Connected to the bus 1012 is an input/output device interface 1009 for connecting various input and output devices, such as a keyboard, mouse, display, speakers, etc. to the system 1001. According to an embodiment of the invention, the input/output device interface 1009 provides an interface for inputting a base musculo-skeletal model. Central processing unit (CPU) 1003 is connected to the bus 1012 and provides for the execution of computer instructions. Memory 1008 provides volatile storage for data used for carrying out computer instructions. Storage 1007 provides non-volatile storage for software instructions such as an operating system (not shown). The system 1001 also comprises a network interface 1002, for connecting to any variety of networks known in the art, including wide area networks (WANs) and local area networks (LANs).

Further connected to the system 1001 is a scale a position module 1004. The scale and position module 1004 may be configured to scale and position a musculo-skeletal model to correspond with motion capture data of a subject according to the methods described hereinabove. Further coupled to the bus 1012 is a data filter module 1005. The data filter module 1005 may be configured to generate kinematically consistent motion data from motion capture data according to the principles of the present invention. The system 1001 further comprises an analysis module 1006 configured to perform an inverse dynamic analysis of a musculo-skeletal model using the kinematically consistent motion data generated by the data filter module 1005. An update module 1010 is communicatively coupled to the analysis module 1006, and the update module 1010 is configured to update the musculo-skeletal model to correspond with at least one analysis results generated by the analysis module 1006. The system 1001 further comprises an optimization module 1011. The optimization module 1011 is configured to optimize muscle activation of the musculo-skeletal model which has been updated by the update module 1010. The optimization module 1011 is configured to optimize the musculo-skeletal model by determining at least one muscle force using the updated musculo-skeletal model, and further updating the updated musculo-skeletal model to correspond with the determined at least one force.

Another embodiment of the system 1001 may further comprise a hybrid modeling module (not shown). The hybrid modeling module may be configured to modify the musculo-skeletal model at any of the stages of development according to the principles of the invention, as described herein, to correspond with at least one of: deformable joint data, ligament data, and soft tissue data. Further, the system 1001 and its various modules may be configured to operate in accordance with any of the methods described herein.

While the various modules of the system 1001 are depicted in FIG. 10 as connected via the bus 1012, it is known to one of ordinary skill in the art that the various modules may be connected in a variety of configurations with one or more modules being remotely located.

Figure 11:
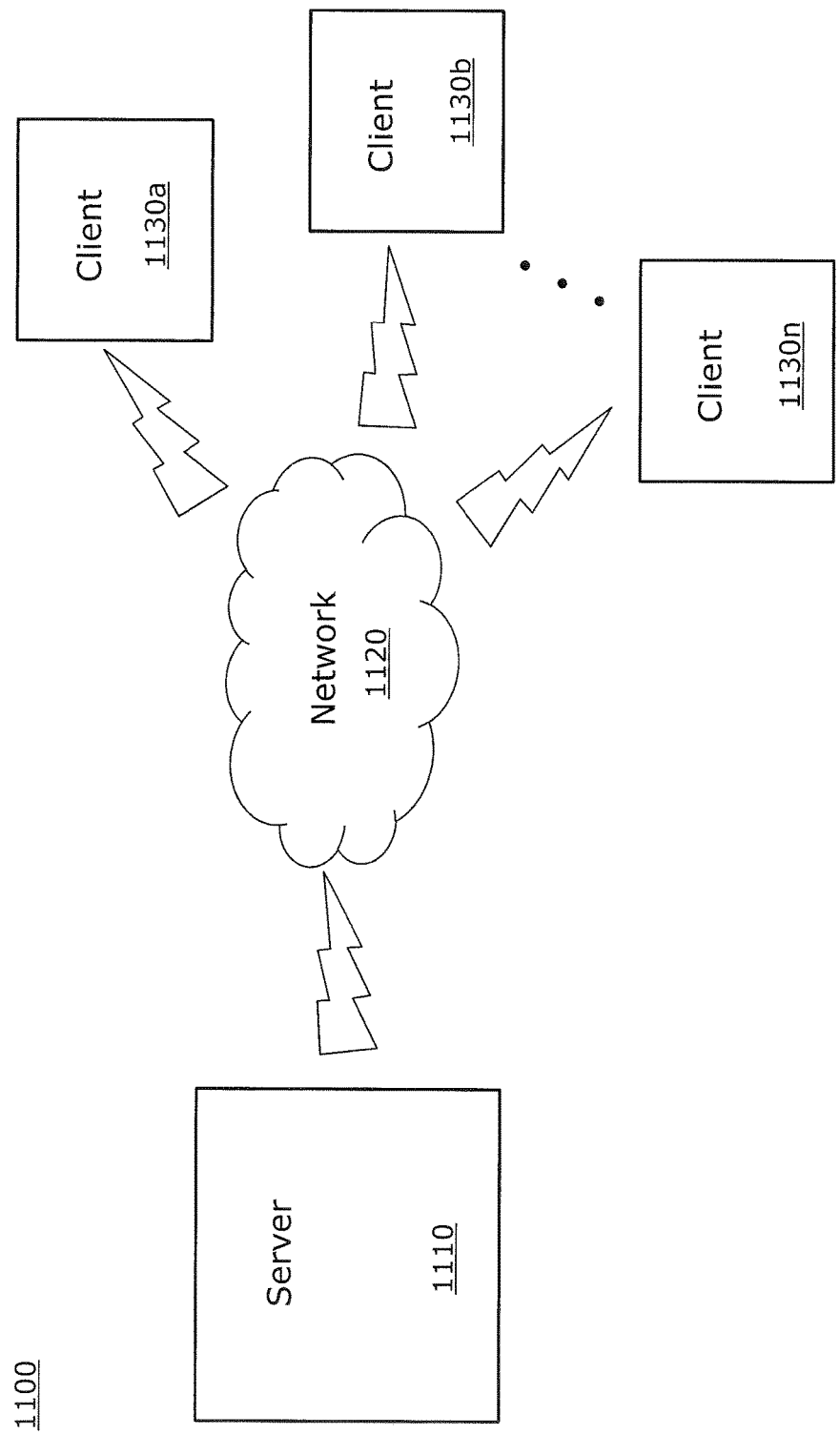
FIG. 11 is a simplified diagram of a computer system in which an embodiment of the present invention may be embodied.

FIG. 11 illustrates a computer network environment 1100 in which the present invention may be implemented. In the computer network environment 1100, the server 1110 is linked through communications network 1120 to clients 1130*a-n*. The environment 1100 may be used to allow the clients 1130*a-n*, alone or in combination with the server 1110, to execute the methods described above.

Embodiments of the present invention may be carried out using commercially available computer aided design (CAD) and computer aided engineering (CAE) tools, such as, but not limited to, Isight and Abaqus. The various embodiments of the invention may be implemented using the process integration framework provided with the software package Isight. Isight enables integration of the individual steps described herein. However, it should be understood that the embodiments described herein require neither Isight, Abaqus, nor any other currently known software. Specifically, described hereinbelow are steps carried out according to the principles of the present invention to model a musculo-skeletal system. In such an embodiment, all steps except the first step receive as inputs numerical data computed or post-processed in the preceding step. The first step, however, receives data input from an external source, in this embodiment, motion capture data from subjects performing activities of daily living in a biomechanics laboratory. The individual steps that enable the example embodiment workflow are outlined below:

First, motion capture (C3D) data is imported into an analysis module, such as one provided in Abaqus. The C3D format is a neutral format supported widely by all motion capture tools (cameras) and in such an embodiment the information may be processed and converted into a format directly usable within Abaqus or other products. Next, a musculo-skeletal model, such as one created in Abaqus/CAE or any other software, is scaled to match the motion capture data. In the musculo-skeletal model the muscles are represented by connector (or line) elements, and the bones are represented as rigid bodies. Following scaling, the method filters skin artifacts and kinematic indeterminacy. Connectors and/or couplings may be used in a manner as described herein to resolve the issues mentioned herein.

Next, an inverse dynamic analysis is performed. There are two versions of the inverse dynamic analysis. In a simpler approach, the muscle and bone configurations outlined above are maintained. In the advanced approach, the muscle configuration is not changed, but fully deformable features as well as other tissue representations are added to provide for more accurate joint and soft tissue representation. The simplified approach treats the bones as rigid and no soft tissue constructs (such as cartilage or ligaments) are considered. In addition, the advanced approach may be used to include interactions between a human subject and products (such as implants/footwear/etc) in an integrated and realistic way. Finally, muscle forces are optimized using an optimization component, such as one provided by Isight or any other software product. The optimization component provides as outputs a measure of muscle activity in response to the activity of daily living being performed by the subject.

It should be understood that the example embodiments described above may be implemented in many different ways and/or using many different software products. In some instances, the various methods and machines described herein may each be implemented by a physical, virtual, or hybrid general purpose computer, or a computer network environment such as the computer environment 1100.

Embodiments or aspects thereof may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It also should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and, thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method of modeling and simulating a musculo-skeletal system, the method comprising:
    scaling and positioning a musculo-skeletal model stored in memory to correspond with motion capture data of a subject stored in the memory, the musculo-skeletal model scaled and positioned having subject specific bone segments, joint locations, and muscle definitions;
    generating kinematically consistent motion data from the motion capture data by filtering out data of skin motion artifacts and tracking errors from the motion capture data by performing a kinematic analysis using a finite element model with: (i) nodes corresponding to markers used to obtain the motion capture data and (ii) one or more shell elements connecting nodes corresponding to respective body segments, wherein each shell element is coupled to a respective reference node at a center of mass of a given body segment through a distributed coupling;
    performing an inverse dynamic analysis of the musculo-skeletal model using the generated kinematically consistent motion data, such that at least one analysis result is generated;
    updating the musculo-skeletal model to correspond with the at least one analysis result of the inverse dynamic analysis;
    optimizing muscle activation of the updated musculo-skeletal model by:
        determining at least one muscle force using the updated musculo-skeletal model; and further updating the updated musculo-skeletal model to correspond with the determined at least one muscle force; and
    simulating musculo-skeletal/product interaction between a product and the further updated musculo-skeletal model.

2. The method of claim 1 further comprising:
    before scaling and positioning, generating the musculo-skeletal model.

3. The method of claim 2 wherein generating the musculo-skeletal model comprises at least one of:
    defining body segments;
    identifying muscle attachment points;
    adding bone geometry;
    defining joint connectors;
    defining muscle connectors;
    adding rigid body constraints; and
    adding markers.

4. The method of claim 1 wherein the at least one result of the inverse dynamic analysis comprises at least one of:
    a joint moment;
    a muscle length;
    a muscle moment arm;
    a muscle velocity;
    a muscle force at zero activation; and
    a muscle force at full activation.

5. The method of claim 1 wherein the motion capture data is video data and the musculo-skeletal model is scaled and positioned using one or more frames of the motion capture data.

6. The method of claim 1 further comprising:
    modifying at least one of the musculo-skeletal model, the updated musculo-skeletal model, and the further updated musculo-skeletal model to correspond with non-linear data including at least one of:
        deformable joint data;
        ligament data; and
        soft tissue data.

7. The method of claim 1 wherein before scaling and positioning:
    the musculo-skeletal model is modified to correspond with non-linear data including at least one of deformable joint data, ligament data, and soft tissue data; and
    wherein the inverse dynamic analysis is non-linear.

8. The method of claim 1 wherein the at least one analysis result is a linear analysis result and before optimizing the muscle activation of the updated musculo-skeletal model, the method further comprising:
    modifying the updated musculo-skeletal model to correspond with non-linear data including at least one of, deformable joint data, ligament data, and soft tissue data;
    scaling and positioning the modified musculo-skeletal model to correspond with the motion capture data of the subject;
    performing a non-linear inverse dynamic analysis of the modified musculo-skeletal model using the generated kinematically consistent motion data such that at least one non-linear analysis result is generated;
    updating the modified musculo-skeletal model to correspond with the at least one non-linear analysis result of the non-linear inverse dynamic analysis; and
    wherein optimizing the muscle activation is performed using the updated modified musculo-skeletal model.

9. The method of claim 1 wherein the at least one analysis result is a linear analysis result and the method further comprising:
    modifying the further updated musculo-skeletal model to correspond with non-linear data including at least one of, deformable joint data, ligament data, and soft tissue data;
    scaling and positioning the modified musculo-skeletal model to correspond with the motion capture data of the subject;
    performing a non-linear inverse dynamic analysis of the modified musculo-skeletal model using the kinematically consistent motion data such that at least one non-linear analysis result is generated;

updating the modified musculo-skeletal model to correspond with at the least one non-linear analysis result of the non-linear inverse dynamic analysis;
optimizing muscle activation of the updated modified musculo-skeletal model by:
determining at least one muscle force using the updated modified musculo-skeletal model; and
further updating the updated modified musculo-skeletal model to correspond with the determined at least one muscle force.

10. A computer system for modeling and simulating a musculoskeletal system, the computer system comprising: a computer memory; and
one or more processors operationally coupled to the memory, the one or more processors configured to cause the system to:
scale and position a musculo-skeletal model stored in the memory to correspond with motion capture data of a subject stored in the memory, the musculo-skeletal model scaled and positioned having subject specific bone segments, joint locations, and muscle definitions;
generate kinematically consistent motion data from the motion capture data by filtering out data of skin motion artifacts and tracking errors from the motion capture data by performing a kinematic analysis using a finite element model with: (i) nodes corresponding to markers used to obtain the motion capture data and (ii) one or more shell elements connecting nodes corresponding to respective body segments, wherein each shell element is coupled to a respective reference node at a center of mass of a given body segment through a distributed coupling;
perform an inverse dynamic analysis of the musculo-skeletal model using the generated kinematically consistent motion data, such that at least one analysis result is generated;
update the musculoskeletal model to correspond with the at least one analysis result of the inverse dynamic analysis;
optimize muscle activation of the updated musculo-skeletal model by:
determining at least one muscle force using the updated musculo-skeletal model; and further updating the updated musculo-skeletal model to correspond with the determined at least one muscle force; and
simulate musculo-skeletal/product interaction between a product and the further updated musculo-skeletal model.

11. The system of claim 10 wherein the computer memory and the one or more processors are further configured to cause the system to:
generate the musculo-skeletal model before scaling and positioning the musculo-skeletal model.

12. The system of claim 11 wherein generating the musculo-skeletal model comprises at least one of:
defining body segments;
identifying muscle attachment points;
adding bone geometry;
defining joint connectors;
defining muscle connectors;
adding rigid body constraints; and
adding markers.

13. The system of claim 10 wherein the at least one result of the inverse dynamic analysis comprises at least one of:
a joint moment;
a muscle length;
a muscle moment arm;
a muscle velocity;
a muscle force at zero activation; and
a muscle force at full activation.

14. The system of claim 10 wherein the motion capture data is video data and the computer memory and the one or more processors are further configured to cause the system to scale and position the musculo-skeletal model using one or more frames of the motion capture data.

15. The system of claim 10 wherein the computer memory and the one or more processors are further configured to cause the system to:
modify at least one of, the musculo-skeletal model, the updated musculo-skeletal model, and the further updated musculo-skeletal model to correspond with non-linear data including at least one of the following:
deformable joint data;
ligament data; and
soft tissue data.

16. The system of claim 10 wherein the computer memory and the one or more processors are configured to cause the system, before scaling and positioning the musculo-skeletal model, to:
modify the musculo-skeletal model to correspond with non-linear data including at least one of deformable joint data, ligament data, and soft tissue data; and
wherein the inverse dynamic analysis is non-linear.

17. The system of claim 10 wherein the at least one analysis result is a linear analysis result and wherein the computer memory and the one or more processors are configured to cause the system, before optimizing muscle activation of the updated musculo-skeletal model, to:
modify the updated musculo-skeletal model to correspond with non-linear data including at least one of deformable joint data, ligament data, and soft tissue data;
scale and position the modified musculo-skeletal model to correspond with the motion capture data of the subject;
perform a non-linear inverse dynamic analysis of the modified musculo-skeletal model using the generated kinematically consistent motion data such that at least one non-linear analysis result is generated;
update the modified musculo-skeletal model to correspond with the at least one non-linear analysis result of the non-linear inverse dynamic analysis; and
optimize muscle activation using the updated modified musculo-skeletal model.

18. The system of claim 10 wherein the computer memory and the one or more processors are further configured to cause the system to:
modify the further updated musculo-skeletal model to correspond with non-linear data including at least one of, deformable joint data, ligament data, and soft tissue data;
scale and position the modified musculo-skeletal model to correspond with the motion capture data of the subject;
perform a non-linear inverse dynamic analysis of the modified musculo-skeletal model using the kinematically consistent motion data such that at least one non-linear analysis result is generated;
update the modified musculo-skeletal model to correspond with the at least one non-linear analysis result of the non-linear inverse dynamic analysis;
optimize muscle activation of the updated modified musculo-skeletal model by:
determining at least one muscle force using the updated modified musculo-skeletal model; and further updating the updated modified musculo-skeletal model to correspond with the determined at least one muscle force.

19. A computer program product for modeling and simulating a musculo-skeletal system, the computer program product executed by a server in communication across a network with one or more clients, the computer program product comprising:

a non-transitory computer readable medium, the computer readable medium comprising program instructions which, when executed by a processor causes:

scaling and positioning a musculo-skeletal model stored in memory to correspond with motion capture data of a subject stored in the memory, the musculo-skeletal model scaled and positioned having subject specific bone segments, joint locations, and muscle definitions;

generating kinematically consistent motion data from the motion capture data by filtering out data of skin motion artifacts and tracking errors from the motion capture data by performing a kinematic analysis using a finite element model with: (i) nodes corresponding to markers used to obtain the motion capture data and (ii) one or more shell elements connecting nodes corresponding to respective body segments, wherein each shell element is coupled to a respective reference node at a center of mass of a given body segment through a distributed coupling;

performing an inverse dynamic analysis of the musculo-skeletal model using the generated kinematically consistent motion data, such that at least one analysis result is generated;

updating the musculo-skeletal model to correspond with the at least one analysis result of the inverse dynamic analysis;

optimizing muscle activation of the updated musculo-skeletal model by:

determining at least one muscle force using the updated musculo-skeletal model; and further updating the updated musculo-skeletal model to correspond with the determined at least one muscle force; and simulating musculo-skeletal/product interaction between a product and the further updated musculo-skeletal model.

\* \* \* \* \*

UNITED STATES PATENT AND TRADEMARK OFFICE
CERTIFICATE OF CORRECTION

| | | |
|---|---|---|
| PATENT NO. | : 10,402,517 B2 | Page 1 of 1 |
| APPLICATION NO. | : 13/927898 | |
| DATED | : September 3, 2019 | |
| INVENTOR(S) | : Subham Sett et al. | |

It is certified that error appears in the above-identified patent and that said Letters Patent is hereby corrected as shown below:

In the Claims

In Claim 10, Column 17, Line 12, delete "musculoskeletal system," and insert -- musculo-skeletal system, --.

In Claim 10, Column 17, Line 37, delete "musculoskeletal model" and insert -- musculo-skeletal model --.

Signed and Sealed this
Twenty-ninth Day of October, 2019

Andrei Iancu
*Director of the United States Patent and Trademark Office*